United States Patent

[11] 3,622,382

[72] Inventors Brack, Karl
Baden, Wurttemberg, Germany;
Edward F. Gorey, Beacon; Guenther H. Schwuttke, Poughkeepsie, N.Y.

[21] Appl. No. 821,908
[22] Filed May 5, 1969
[45] Patented Nov. 23, 1971
[73] Assignee International Business Machines Corporation
Armonk, N.Y.

[54] SEMICONDUCTOR ISOLATION STRUCTURE AND METHOD OF PRODUCING
9 Claims, 7 Drawing Figs.

[52] U.S. Cl. .......... 117/201, 117/212, 117/93.3, 117/118, 117/DIG. 12, 148/1.5
[51] Int. Cl. .......... B44d 1/18, H01l 7/14
[50] Field of Search .......... 117/201, 93.3, 212, 118; 148/1.5; 317/235

[56] References Cited
UNITED STATES PATENTS
3,515,956 6/1970 Martin et al. .......... 317/234

*Primary Examiner*—William L. Jarvis
*Attorneys*—Hanifin and Jancin and Wolmar J. Stoffel

ABSTRACT: A monocrystalline semiconductor body provided with a subsurface insulating layer. The layer is produced by bombarding the body with ions such as nitrogen, oxygen and carbon, for a time sufficient to produce a dense layer of embedded ions and at an energy level sufficient to result in ion penetration to the desired subsurface depth. The body is subsequently heated to a temperature sufficient to react the embedded ions with ions of the semiconductor body to produce an insulating layer.

INVENTORS
KARL BRACK
EDWARD F. GOREY
GUENTHER H. SCHWUTTKE

BY Wolmar J. Stoffel
ATTORNEY

SEMICONDUCTOR ISOLATION STRUCTURE AND METHOD OF PRODUCING

BACKGROUND OF THE INVENTION

1. Field of the Invention

The invention relates to the manufacture of semiconductor devices, more particularly isolation techniques for insulating portions of a monocrystalline semiconductor body.

2. Description of the Prior Art

Monolithic integrated circuit devices normally have a number of active elements, such as transistors and diodes, and passive elements such as resistors and capacitors formed in or on the same monocrystalline semiconductor body. These elements are interconnected into a circuit by a pattern of metallization on an insulating film covering the surface of the semiconductor body. In order to prevent unwanted electrical interaction of the elements with each other, it is necessary to provide internal isolation between the active and passive elements of the device.

Various structures and techniques have been proposed to provide such isolation. PN-junctions have been fabricated in the semiconductor body between the active and passive elements. This is commonly referred to as "junction isolation." There are a number of disadvantages with this type of insulation. The existence of PN-junctions and the fields created thereby introduces parasitic capacitance which is normally undesirable, particularly in high-speed devices. Another disadvantage which is particularly important in devices used by the military and also in devices utilized in outer space is that the junctions are radiation sensitive. Exposure to significant amounts of radiation alters or breaks down the isolating junctions, thereby potentially destroying the operability of such devices. Another method of insulating the various devices in the monolithic integrated circuit is to surround each device with a layer of insulating material. This is commonly referred to as "dielectric isolation." Various methods are available for surrounding the devices as, for example, etching channels in a semiconductor wafer separating the various regions of the device, forming an insulating layer over the top surface of the device, and subsequently inverting the device and removing the balance of the wafer down to the bottoms of the channels. This leaves segments of the wafer exposed which are surrounded by the insulation material which also serves as a backing structure. Such fabrication techniques, however, are time consuming, tedious, and very exacting.

It would be very desirable if an insulating layer could be formed without a monocrystalline semiconductor body. This cannot be accomplished by growing an insulating layer over the top surface of a wafer and subsequently growing an epilayer over the insulating layer, since the formation of an epilayer depends upon the existence of an underlying crystal lattice. Normally an epilayer cannot be grown on the top of a polycrystalline insulating layer.

SUMMARY OF THE INVENTION

An object of the invention is to provide a method of forming an insulating layer within a monocrystalline body.

Another object of this invention is to provide, in a monocrystalline semiconductor body a subsurface layer of insulating material.

In accordance with the aforementioned objects, the method of the invention involves bombarding a monocrystalline semiconductor body with ions of at least one element, such as nitrogen, oxygen, or carbon, and maintaining the bombardment for a time sufficient to produce a dense layer of implanted ions. The energy level of bombardment is controlled to result in ion penetration to the desired depth. The resultant bombarded body is thereafter heated to a temperature of at least 1,100° C. to react the ions introduced during the bombardment with ions within the body, which, when combined, form an insulating layer.

The device of the invention is a monocrystalline semiconductor body having a subsurface layer of insulating material.

DESCRIPTION OF THE PREFERRED EMBODIMENTS

Figure 1:
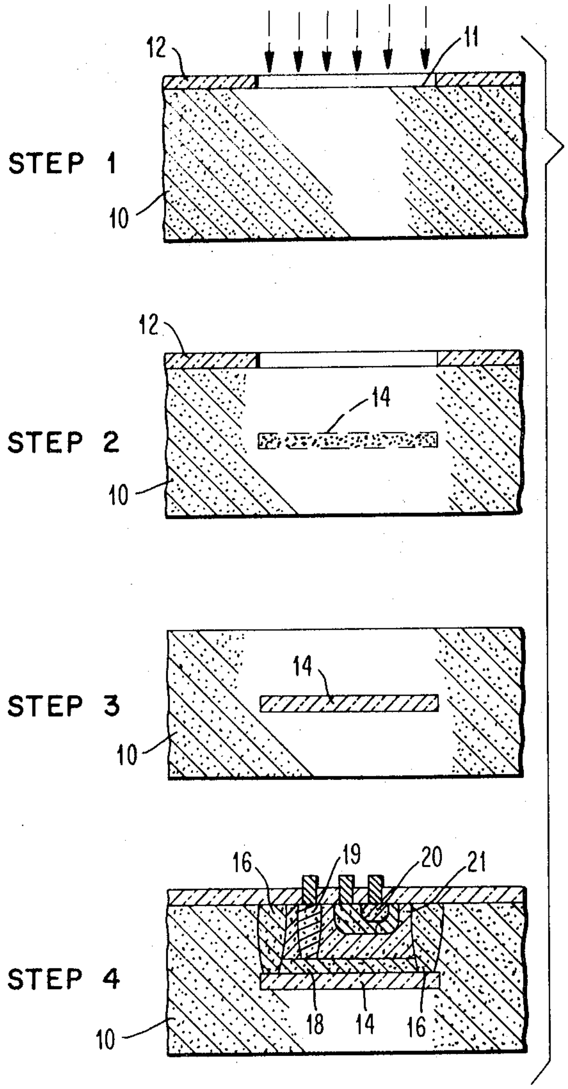
FIG. 1 is a flow diagram illustrating the process of the invention of forming buried insulating layers in a monocrystalline body.
Figure 2:
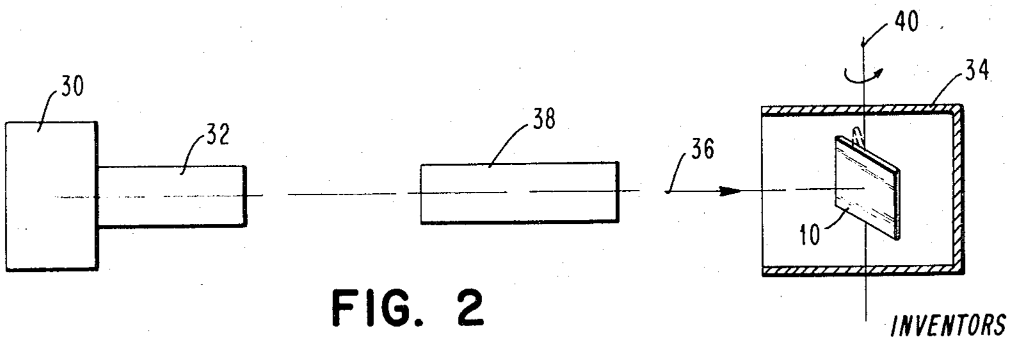
FIG. 2 is a diagrammatic view of an apparatus for ion implantation suitable for use in carrying out the process of the invention.

In the process of forming a buried layer in a monocrystalline body, ions are implanted in the body in well-defined regions as generally indicated in FIG. 1. The apparatus for achieving the implanting of the ions is shown diagrammatically in FIG. 2. Briefly, an atom of some element is ionized in the ion source 30 and accelerated by a potential gradient through accelerator 32 to an energy high enough to be implanted in target 10 in target chamber 34. Since the beam 36 of the particles is charged, it is affected by magnets and electric fields and thus may be focused and deflected in chamber 38 or by a mass with separate magnets.

The depth to which the ions of beam 36 are implanted in target 10 is a function of the ion beam energy and the angle of incidence of the beam with respect to the target 10. The angle of incidence may be controlled, for instance, by rotating target 10 about an axis 40. Generally, an ion beam with an energy of 5 kev. to 3 mev. is sufficient for implanting ions in the monocrystalline substrate 10.

A number of methods are available for controlling the area of implantation. Because the ion is affected by magnetic and electrical fields, it may be focused and deflected electrostatically in such a manner as to trace out or describe the area to be implanted. A second method would be to provide a mask somewhere along the path of beam 36 which would selectively block out portions thus providing areas of implantation on the target 10.

A third method for controlling the areas of implantation is through the use of masking the substrate's surface with a suitable masking material. An material which can be laid on the surface of the body in a thin film may be used to mask areas of the wafer 10 which are not to be implanted. Normally the masking films are deposited and shaped to expose desired areas of the body by utilizing conventional photolithographic techniques.

In carrying out the method of the invention, a monocrystalline semiconductor body 10, preferably silicon, is bombarded with atoms as shown in Step 1 of FIG. 1. The bombardment can be done along any direction relative to the axis of the crystal. However, it is preferable that the bombardment be done at an angle which is 2° off one of the major crystal axes. The angle of the crystal lattice relative to the direction of bombardment will influence the depth of penetration. By inclining the axis of the crystal a small degree relative to the direction of bombardment, a more close packing of the implanted ions within the body will result. The area of bombardment can be controlled by any of the aforementioned methods. As show in Step 1, the surface 11 of body 10 is masked with a masking layer 12. The masking layer prevents ions from penetrating into the body 10 in the masked areas. The masking layer 12 can be any suitable metal or insulation material. Typical materials include molybdenum, tungsten, platinum, gold, silver, $SiO_2$, $Si_3N_4$, etc. Normally the masking layer will need be only a few thousand angstroms in thickness and can be shaped by conventional photolithographic techniques.

Figure 3:
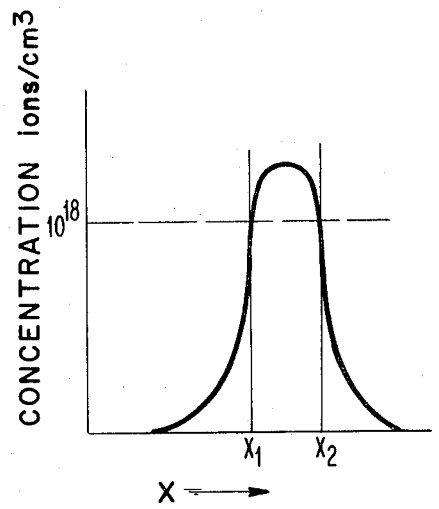
FIG. 3 is a plot of concentration of implanted atoms in a semiconductor body vs. distance.

As shown in Step 2, a region or layer 14 is formed within body 10 under the unprotected or unmasked areas of the body 10. Within region 14 there are high concentrations of implanted ions. The depth of region 14 within body 10 will depend upon the energy of bombardment. In general, energies of 0.8 mev. or greater are utilized depending on the depth of penetration desired. FIG. 3 illustrates the cross-sectional profile of the resultant device pictured in Step 2 of FIG. 1. The concentration of implanted ions in region 14 is $10^{18}$ to $10^{22}$ ions per cc. As indicated in Step 2, the ions implanted in body 10 depend on the type of insulating layer to be formed. Typical insulating layers are silicon nitride, silicon carbide, and silicon oxide. In the formation of a silicon nitride layer in a silicon body, nitrogen ions would be implanted. In the formation of the silicon carbide layer in a silicon body, carbon ions would be implanted. In the formation of a silicon dioxide layer in a silicon body, oxygen ions would be implanted.

Following the bombardment the body 10 is heated to a temperature of 1,100° C. for a time sufficient to react the implanted ions with ions within the body. The time is generally one-half hour or greater. The heating on the order can be done in air, a vacuum or in an inert atmosphere; as for example, under nitrogen or argon. This heating treatment causes the implanted ions, that is nitrogen, carbon, or oxygen, to react with the silicon ions or like ions in body 10 which together form an insulating layer. This results in the formation of an amorphous insulating layer. In order to form an effective continuous insulating layer, the concentration of the implanted ions in general must be $10^{19}$ or greater, more preferably $10^{20}$ to $10^{22}$ ions/cc. It is possible that the body 10 could be of some other monocrystalline semiconductor material such as gallium arsenide or germanium and silicon ions could be implanted in the same general regions of the implanted nitrogen, oxygen or carbon atoms and thereafter reacted.

The body 10 provided with a buried insulating layer 14 can thereafter be processed to form an integrated semiconductor device as indicated in Step 4 of FIG. 1. The layer 14 provides an effective insulating layer for the bottom surface of the device. The sides of an active or passive device in an integrated circuit can be insulated by any suitable technique, as for example by junction isolation 16. Diffused regions 16 can be formed by suitable diffusion techniques or by ion implantation. Alternately the sides of the device can be insulated by dielectric isolation techniques, as for example etching channels and refilling with a suitable dielectric material. Still further the periphery of the device can be bombarded with the same ions used in the forming of layer 14 and subsequently annealing to form a vertical embedding layer surrounding the device. The ions forming the sidewalls of an insulating layer can be implanted in the semiconductor body by any suitable means, as for example, varying the energy, or by suitable masking techniques which serve to bring side extensions of the layer to the surface. Thereafter a buried subcollector region 18 can be produced by ion implantation and a reach through region 19 made to establish a low-resistance electrical contact. Emitter and base regions 20 and 21 can be formed by either ion implantation or conventional diffusion techniques. The techniques useful for forming the various regions by ion implantation are adequately and completely disclosed in a copending commonly assigned application, Ser. No. 750,650, filed Aug. 6, 1968. The subsurface insulating layer, and the method of producing it of the invention can be utilized in applications other than integrated circuit isolation. It can be used in, for example, photon waveguides, optical devices, and others.

The following are specific examples of practicing the method of the present invention. The examples are merely included to aid in the understanding of the invention, and variations may be made by one skilled in the art without departing from the spirit and scope of the invention.

EXAMPLE I

Three silicon wafers having surfaces inclined approximately 2° to the <111> lattice plane orientation were selected as specimens and numbered 1, 2, and 3. All of the specimens were subjected to an approximately 40 microamp ion beam from a van de Graaff generator for a time of 15 minutes. The bombarding ions were nitrogen ions derived from nitrogen gas. The bombardment was done with the wafers at room temperature. The fluence of number 1 and 3 wafers during the bombardment was larger than $10^{20}$ ions/cm.$^2$. The fluence during the bombardment of number 2 specimen was $10^{16-18}$ ions/cm.$^2$. Following the bombardment, the wafers were inspected for surface damage; none was evident.

EXAMPLE II

Figure 4A:
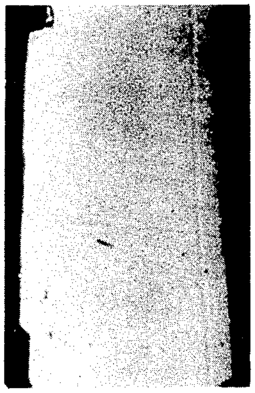
FIG. 4*a* and 4*b* are photomicrographs of a buried $Si_3N_4$ layer in a silicon wafer, produced in accordance with the method of the invention.
Figure 4B:
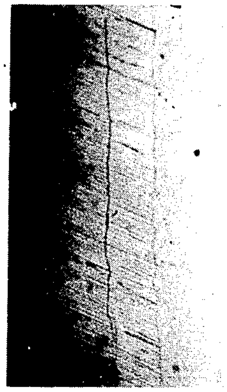
Figure 5:
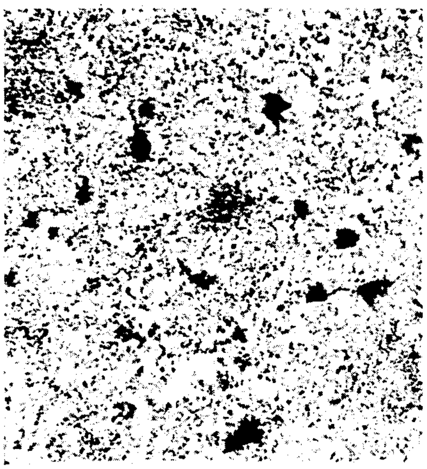
FIG. 5 is a transmission electron micrograph of a $Si_3N_4$ film produced in accordance with the method of the invention.
Figure 6:
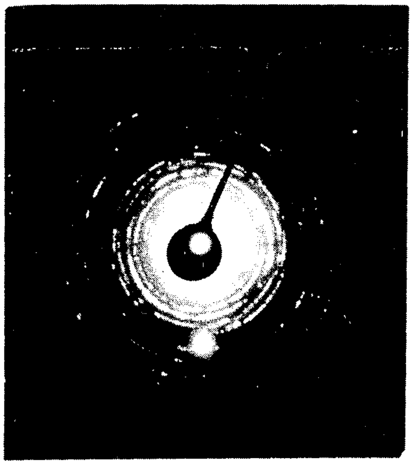
FIG. 6 is a photo of a diffraction pattern of the film of FIG. 5 which definitely establishes that it is $\alpha Si_3N_4$.

Wafers number 1 and 2 were heated at 1,100° C. in air for a period of 1 hour. Wafer number 3 was annealed at 800° C. in air for a period of 1 hour. Subsequent to bombardment, wafer number 1 was beveled to determine the presence of any physical change. FIG. 4A, which is a photomicrograph of the wafer, indicates a relatively thick disturbed layer below the surface. Following the heat treatment, a second photomicrograph of number 1 wafer was made which indicated a sharp, well-defined layer approximately 2$\mu$ below the surface. This photomicrograph is shown in FIG. 4B of the drawing. Transmission electron micrographs of each of the specimens 1 through 3 were then prepared. In wafer number 1 the transmission electron micrograph positively showed the existence of a continuous film. This transmission electron micrograph is shown in FIG. 5 of the drawing. A selected area diffraction pattern of the film, shown in FIG. 6, positively identified the film as $\alpha Si_3N_4$. The transmission electron micrograph of number 2 wafer showed scattered precipitates of silicon nitride in a plane parallel to the surface of the wafer. The film was not continuous and clearly would not function as an insulating layer. The transmission electron micrograph of wafer number 3 showed an amorphous silicon layer with scattered silicon nitride precipitates. This clearly indicated that an annealing temperature of 800° C. was insufficient to convert the imbedded nitrogen ions to a continuous film of silicon nitride.

EXAMPLE III

Wafer number 1 was annealed for an additional hour at 1,200° C. in air. A transmission electron micrograph of a portion of the wafer indicated that the additional heating produced only a small change in the physical dimensions of the silicon nitride layer.

EXAMPLE IV

Two silicon wafers similar to the wafers described in example I were selected as specimens and labeled number 4 and number 5. Wafer number 4 was subjected to a 40-microamp beam of carbon ions produced by a van de Graaff generator. The bombardment lasted for approximately 15 minutes resulting in a bombardment of 600 microamp/minute. The intensity in the beam was greater than $10^{20}$ ions/cm.$^2$. Wafer number 5 was subjected to the same type of bombardment with the same apparatus except that the fluence was reduced to $10^{16-17}$ ions/cm.$^2$.

EXAMPLE V

The wafers were both annealed for 1 hour at 1,100° C. in air, and subsequently examined. An X-ray topograph and electron-microscopy indicated the presence of a continuous silicon carbide layer in wafer number 4, and scattering of precipitates of silicon carbide in a plane parallel to the surface of the wafer in wafer number 5.

EXAMPLE VI

Two silicon wafers similar to the wafers described in example I were selected as specimens and numbered 6 and 7. Both wafers were then subjected to a 40 microamp beam of oxygen atoms produced by a van de Graaff generator. The bombardment was continued for 15 minutes. The fluence of number 6 wafer was greater than $10^{20}$ ions/cm.$^2$ while the fluence of number 7 wafer was $10^{16}$ to $10^{18}$ ions/cm.$^2$. Both wafers were subsequently annealed at 1,200° C. for 1 hour. X-ray topographs of the specimens indicated the presence of a silicon oxide layer in specimen number 6 and precipitation of silicon oxide in specimen number 7.

While the invention has been particularly shown and described with reference to preferred embodiments thereof, it will be understood by those skilled in the art that various changes in form and detail may be made therein without departing from the spirit and scope of the invention.

We claim:

1. A method of producing a subsurface insulating layer in a monocrystalline silicon body comprising:
   bombarding the body with ions of at least one element selected from the group consisting of nitrogen, oxygen, and carbon,
   maintaining the bombardment for a time sufficient to produce an implanted ion concentration of at least $10^{19}$ ions per cc. and at an energy level sufficient to result in ion penetration to the desired subsurface depth, and
   heating the resultant bombarded body to a temperature of at least 1,100° C.

2. The method of claim 1 wherein a crystal axis of said body is disposed at a small angle relative to the path of the bombarding ions.

3. The method of claim 2 wherein said angle is on the order of 2°.

4. The method of claim 1 wherein said element is nitrogen, and the concentration of the implanted ions is from $10^{20}$ to $10^{22}$ ions/cc.

5. The method of claim 1 wherein the energy of bombardment is at least 0.8 mev.

6. A method of producing a subsurface insulating layer in a monocrystalline semiconductor body comprising:
   bombarding the body with ions of at least one element selected from the group consisting of nitrogen, oxygen, and carbon,
   maintaining the bombardment for a time sufficient to produce an ion concentration of at least $10^{19}$ ions per cc. and at an energy level sufficient to result in ion penetration to the desired depth.
   heating the resultant bombarded body to a temperature sufficient to react the ions introduced by the bombardment with ions within the body.

7. A semiconductor device having a subsurface insulating layer in a monocrystalline silicon body, said subsurface insulating layer produced by the following steps:
   bombarding the body with ions of at least one element selected from the group consisting of nitrogen, oxygen, and carbon,
   maintaining the bombardment for a time sufficient to produce an implanted ion concentration of at least $10^{19}$ ions per cc. and at an energy level sufficient to result in ion penetration to the desired depth, and
   heating the resultant bombarded body to a temperature sufficient to react the ions introduced by the bombardment with ions within the body.

8. The semiconductor device of claim 7 wherein said bombarding ion is nitrogen resulting in a subsurface layer of $Si_3N_4$.

9. The semiconductor device of claim 7 wherein said bombarding ion is oxygen resulting in a subsurface layer of $SiO_2$.

* * * * *